(12) United States Patent
Jin et al.

(10) Patent No.: US 10,536,114 B2
(45) Date of Patent: Jan. 14, 2020

(54) OSCILLATOR CIRCUIT

(71) Applicant: SEMICONDUCTOR COMPONENTS INDUSTRIES, LLC, Phoenix, AZ (US)

(72) Inventors: Wookang Jin, Bucheon (KR); Sungwon Yun, Seoul (KR); Chan Son, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 209 days.

(21) Appl. No.: 15/641,581

(22) Filed: Jul. 5, 2017

(65) Prior Publication Data

US 2019/0013779 A1    Jan. 10, 2019

(51) Int. Cl.
*H03K 3/26* (2006.01)
*H03B 5/24* (2006.01)

(52) U.S. Cl.
CPC ....... *H03B 5/24* (2013.01); *H03B 2200/0038* (2013.01); *H03B 2200/0048* (2013.01); *H03B 2200/0062* (2013.01); *H03B 2200/0064* (2013.01); *H03B 2201/038* (2013.01)

(58) Field of Classification Search
CPC .............. H03B 5/24; H03B 2200/0062; H03B 2201/038; H03B 2200/0064; H03B 2200/0048; H03B 2200/0038; H03K 3/0231

USPC .................. 331/57, 111, 143, 185, 186, 187
See application file for complete search history.

(56) References Cited

U.S. PATENT DOCUMENTS

| | | | | |
|---|---|---|---|---|
| 6,072,372 A * | 6/2000 | Yokoyama | ........... | H03K 3/0315 331/177 R |
| 6,617,933 B2 * | 9/2003 | Ito | ........................ | H03L 7/093 331/25 |
| 6,731,558 B2 * | 5/2004 | Yamauchi | ................ | G11C 7/04 365/189.09 |
| 2002/0050868 A1 * | 5/2002 | Chen | ...................... | H03K 3/011 331/143 |
| 2013/0049875 A1 * | 2/2013 | Shiga | ..................... | H03K 3/011 331/144 |

* cited by examiner

*Primary Examiner* — Richard Tan
(74) *Attorney, Agent, or Firm* — AMPACC Law Group, PLLC (57) ABSTRACT

An oscillator circuit includes an oscillator having a source node and a sink node, the oscillator being configured to generate a pulse signal having an output voltage that corresponds to a charging or discharging operation of a capacitor, a first bias current generating circuit coupled to the source and the sink nodes of the oscillator and configured to supply a first bias current to the oscillator, the first bias current being adjustable, and a second bias current generating circuit coupled to the source and the sink nodes of the oscillator and configured to supply a second bias current to the oscillator, the second bias current being adjustable. The first bias current and the second bias current are used to tune a frequency range of the oscillator.

20 Claims, 6 Drawing Sheets

OSCILLATOR CIRCUIT

FIELD OF THE DISCLOSURE

This present disclosure relates to an oscillator circuit, and more particularly, to an oscillator circuit, a method of tuning a frequency range of the same, and an electrical device including the same.

BACKGROUND

Integrated circuit (IC) devices, which include a pulse width modulation (PWM) IC, a switching regulator, a power converter, a power supplier, and so on, use a wide range oscillator circuit to obtain a pulse signal having an oscillation frequency varying in a predetermined frequency range.

For example, in a PWM IC, it is important to accurately tune a minimum frequency and a maximum frequency defining a predetermined frequency range. An oscillation frequency varies between the minimum frequency and the maximum frequency, depending on a control voltage of a feedback loop in the PWM IC.

BRIEF DESCRIPTION OF THE DRAWINGS

In the accompanying figures like reference numerals refer to identical or functionally similar elements throughout the separate views, together with the detailed description below, and are incorporated in and form part of the specification to further illustrate embodiments of concepts that include the claimed invention and explain various principles and advantages of those embodiments.

DETAILED DESCRIPTION

Embodiments relate to an oscillator circuit for tuning a frequency range.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Like reference numerals designate like elements in the specification.

In an embodiment, an oscillator circuit includes an oscillator having a source node and a sink node, the oscillator being configured to generate a pulse signal having an output voltage that corresponds to a charging or discharging operation of a capacitor, a first bias current generating circuit coupled to the source and the sink nodes of the oscillator and configured to supply a first bias current to the oscillator, the first bias current being adjustable, and a second bias current generating circuit coupled to the source and the sink nodes of the oscillator and configured to supply a second bias current to the oscillator, the second bias current being adjustable, wherein the first bias current and the second bias current are used to tune a frequency range of the oscillator.

In an embodiment, an oscillator circuit includes an oscillator, a first bias current generating circuit, and a second bias current generating circuit. The first bias current generating circuit includes a variable resistor and supplies a first bias current to the oscillator, varying based on a control voltage and a resistance of the variable resistor. The second bias current generating circuit includes a current source and supplies a second bias current to the oscillator, the second bias current varying by controlling the current source. The first bias current and the second bias current are used to tune a frequency range of the oscillator.

Figure 1:
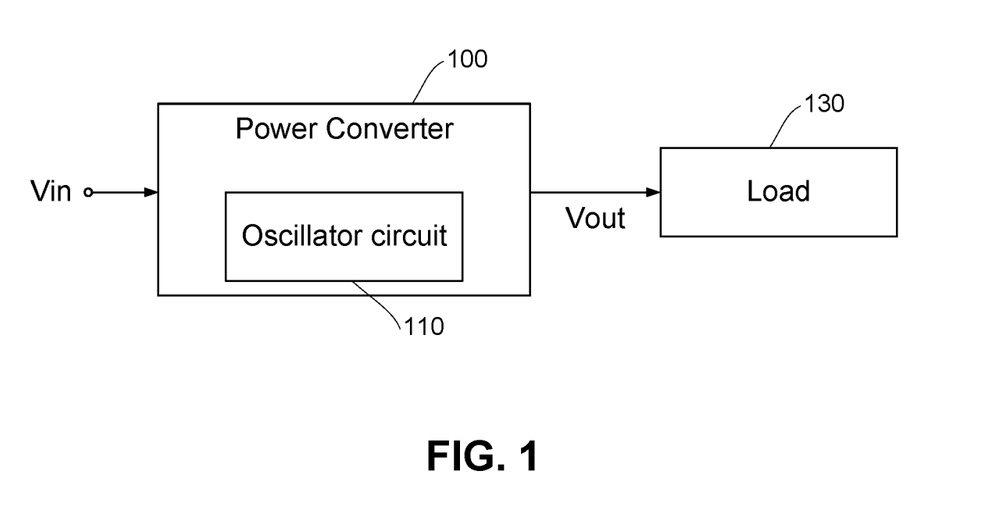
FIG. 1 illustrates an integrated circuit device including an oscillator circuit according to an embodiment.

FIG. 1 illustrates an integrated circuit device 100 including an oscillator circuit 110 according to an embodiment. The integrate circuit 100 may include a pulse width modulation (PWM) IC, a switching regulator, a power converter, a power supplier, and so on.

The integrated circuit device 100, e.g., a power converter, receives an input voltage Vin and provides an output voltage Vout to a load 130.

The power converter 100 of FIG. 1 includes the oscillator circuit 110. The oscillator circuit 110 of FIG. 1 may be integrated in a semiconductor chip, and the semiconductor chip may be packaged by itself or together with one or more other semiconductor chips.

The load 130 of FIG. 1 may include one or more integrated chips (ICs). In an embodiment, the output voltage Vout is used to supply power to a Central Processing Unit (CPU), a Graphics Processing Unit (GPU), an integrated memory circuit, a battery charger, a light emitting diode (LED), or other types of electrical load.

Figure 2:
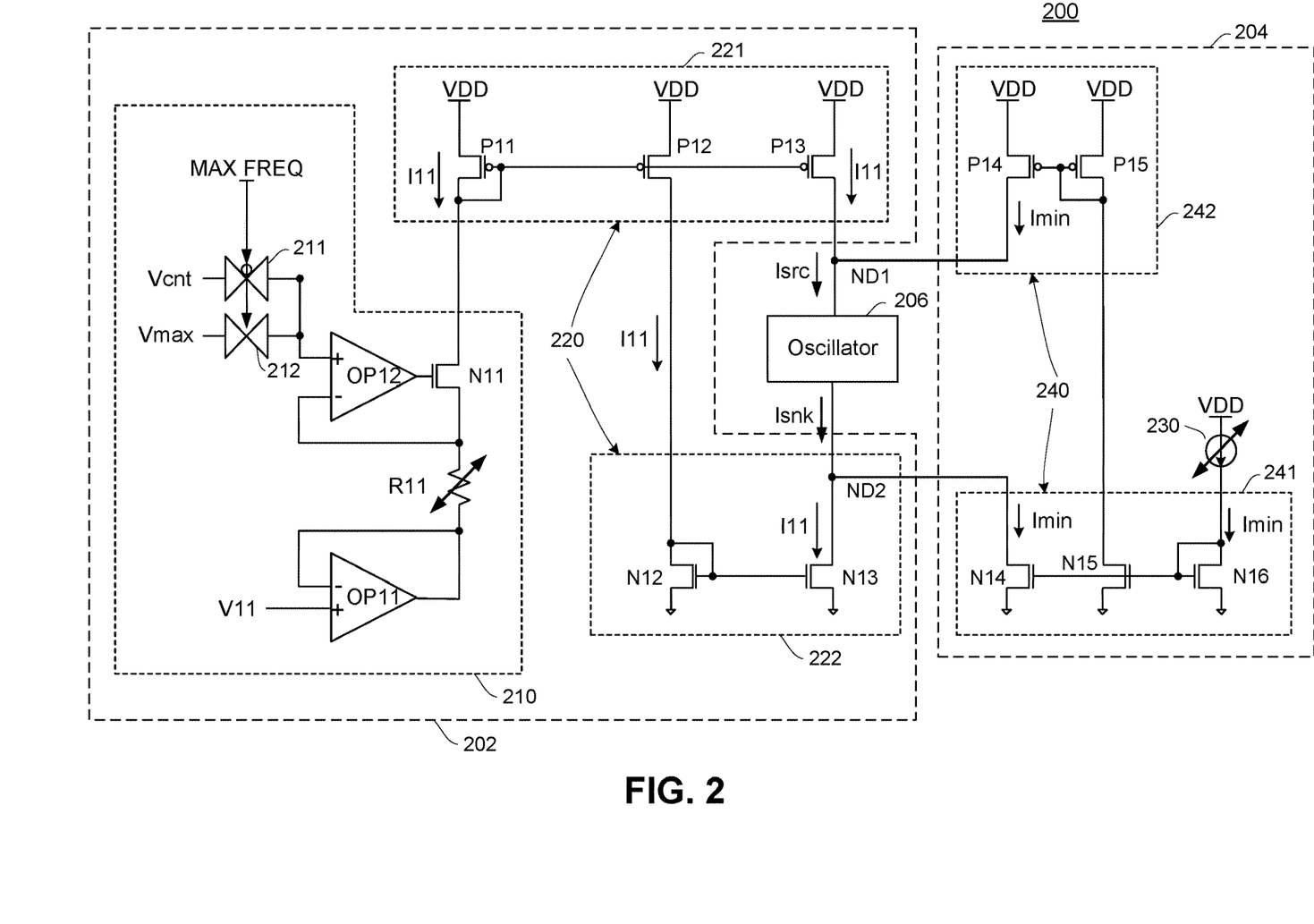
FIG. 2 illustrates an oscillator circuit according to an embodiment.

FIG. 2 illustrates an oscillator circuit 200 according to an embodiment. The oscillator circuit 200 generates a pulse signal having an oscillation frequency, which is set to be in a given frequency range. The oscillator circuit 200 may be used in a pulse width modulation (PWM) integrated circuit (IC). In an embodiment, the given frequency range is set to have a range of 1 kHz to 20 kHz.

The oscillator circuit 200 of FIG. 1 includes a first bias current generating circuit 202, a second bias current generating circuit 204, and an oscillator 206. The first bias current generating circuit 202 includes a voltage/current converting circuit 210 and a first current mirror circuit assembly 220. The first current mirror circuit assembly 220 includes a first current mirror circuit 221 and a second current mirror circuit 222.

The first bias current generating circuit 202 and the second bias current generating circuit 204 of FIG. 1 collectively control levels of a sourcing current Isrc and a sinking current Isnk, which form a current path through the oscillator 206.

The oscillator 206 of FIG. 1 generates the pulse signal having the oscillation frequency, the oscillation frequency being set to be in the given frequency range based on the sourcing current Isrc and the sinking current Isnk that are applied to a first node, e.g., a source node, ND1 and a second node, e.g., a sink node, ND2, respectively. As used herein, the given frequency range is also referred to as a "predetermined frequency range."

Figure 3:
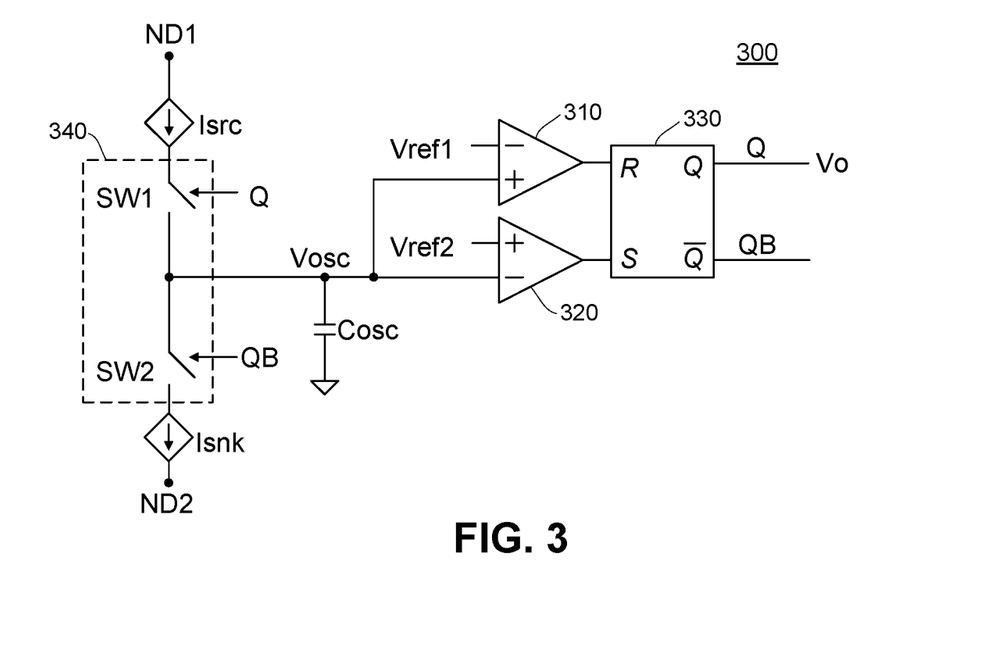
FIG. 3 illustrates an oscillator that may be used in an oscillator circuit according to an embodiment.

FIG. 3 illustrates an oscillator 300 that may be used in an oscillator circuit according to an embodiment. The oscillator 300 is an example of the oscillator 206 used in the oscillator circuit 200 shown in FIG. 2.

The oscillator 300 of FIG. 3 includes a saw-tooth oscillator (also called a triangular oscillator). The oscillator 300 includes a feedback switching circuit 340, a capacitor Cosc, first and second comparators 310 and 320, and an RS flip-flop 330.

The capacitor Cosc of FIG. 3 has a first end commonly coupled to the first comparator 310, the second comparator 320, and the feedback switching circuit 340, and has a second end coupled to a ground voltage terminal.

The first comparator 310 of FIG. 3 receives a voltage Vosc of the capacitor Cosc at its positive input terminal (+), which is coupled to the first end of the capacitor Cosc, and receives a first reference voltage Vref1 at its negative input terminal (−). The second comparator 320 of FIG. 3 receives a second reference voltage Vref2 at its positive terminal (+), and receives the capacitor voltage Vosc at its negative terminal (−), which is coupled to the first end of the capacitor Cosc. The first and second reference voltages Vref1 and Vref2 determine a swing width of the capacitor voltage Vosc in an embodiment.

The RS flip-flop 330 of FIG. 3 receives an output signal of the first comparator 310 at a reset (R) input terminal, and receives an output signal of the second comparator 320 at a set (S) input terminal. The RS flip-flop 330 outputs a pulse signal having an output voltage Vo through a first output terminal Q, and outputs an inverted pulse signal having an opposite phase to the pulse signal through a second output terminal QB.

The feedback switching circuit 340 of FIG. 3 includes first and second switches SW1 and SW2. The first switch SW1 is coupled to and disposed between the first node ND1 and the first end of the capacitor Cosc, and the second switch SW2 is coupled to and disposed between the first end of the capacitor Cosc and the second node ND2. The first and second switches SW1 and SW2 operate in response to the pulse signal and the inverted pulse signal output through the first output terminal Q and the second output terminal QB, respectively, of the RS flip-flop 330. In an embodiment, the first and second switches SW1 and SW2 include NMOS transistors receiving the output voltage Vo and the inverted output voltage through gate terminals thereof, respectively. However, embodiments are not limited thereto.

In other embodiments, the feedback switching circuit 340 may include any other switching elements. In an embodiment, the first switch SW1 of FIG. 3 may include a PMOS transistor and the second switch SW2 of FIG. 3 may include an NMOS transistor. Thus, both of the PMOS transistor and the NMOS transistor may selectively operate in response to the output voltage Vo.

In the oscillator 300 of FIG. 3, if the output voltage Vo of the pulse signal has a high level, the first switch SW1 is turned on and the second switch SW2 is turned off. At this time, the capacitor Cosc is charged by the sourcing current Isrc as the sourcing current Isrc flows to the capacitor Cosc through the first switch SW1 from the node ND1. If the capacitor voltage Vosc becomes higher than the first reference voltage Vref1 as a result of the charge operation, the output signal of the first comparator 310 has a high level, and thus the RS flip-flop 330 is reset, such that the output voltage Vo changes to a low level.

On the other hand, if the output voltage Vo has a low level, the first switch SW1 is turned off and the second switch SW2 is turned on. At this time, the capacitor Cosc is discharged by the sinking current Isnk as the sinking current Isnk flows to the second node ND2 through the second switch SW2. If the capacitor voltage Vosc becomes less than the second reference voltage Vref2 as a result of the discharge operation, the output signal of the second comparator 320 has a high level, and thus the RS flip-flop 330 is set, such that the output voltage Vo changes to a high level.

When the output voltage Vo changes to the high level, the above-mentioned charge operation is performed again. These repeating charge and discharge operations result in an oscillation, and generate the pulse signal having the oscillation frequency.

Provided that the sourcing current Isrc and the sinking current Isnk are substantially constant and the substantially same as I, i.e., Isrc=Isnk=I, an oscillation period T can be represented by Equation 1 below, and the oscillation frequency f of the pulse signal can be represented by Equation 2 below:

$$T=(2*Cosc*(Vref1-Vref2))/I \qquad \text{Equation 1, and}$$

$$f=I/(2*Cosc*(Vref1-Vref2)) \qquad \text{Equation 2,}$$

wherein Cosc is indicative of a capacitance of the capacitor Cosc, Vref1 corresponds to a high voltage level of the capacitor voltage Vosc, and Vref2 corresponds to a low voltage level of the capacitor voltage Vosc. Thus, the capacitor voltage Vosc varies between the first reference voltage Vref1 and the second reference voltage Vref2.

As can be seen from Equation 2, the oscillation frequency f may change according to the constant current I (=Isrc=Isnk) since the capacitance of the capacitor Cosc and levels of the first and second reference voltages Vref1 and Vref2 are predetermined.

Therefore, a frequency range of the oscillation frequency f may be tuned by accurately adjusting the levels of the sourcing current Isrc and the sinking current Isnk.

Referring back to FIG. 2, the first bias current generating circuit 202 and the second bias current generating circuit 204 supply the sourcing current Isrc and the sinking current Isnk to the oscillator 206 (or the oscillator 300 in FIG. 3), to thereby tune the frequency range of the oscillation frequency f and provide the oscillation frequency f varying, within the tuned frequency range, depending on a control voltage Vcnt after the frequency range has been tuned. The control voltage Vcnt is an external voltage provided from the outside of the oscillator circuit 200. The control voltage Vcnt may correspond to an output voltage of a feedback loop of a circuit device using the pulse signal output from the oscillator circuit 200.

The voltage/current converting circuit 210 of FIG. 2 includes a first operational amplifier OP11, a second operational amplifier OP12, a variable resistor R11, an NMOS transistor N11, a first input unit 211, and a second input unit 212.

The first operational amplifier OP11 of FIG. 2 receives a first voltage V11 at its positive input terminal (+). A negative input terminal (−) of the first operational amplifier OP11 is connected to a common node of a first end of the variable resistor R11 and an output terminal of the first operational amplifier OP11.

The second operational amplifier OP12 of FIG. 2 includes a positive input terminal (+) through which one of voltages Vcnt and Vmax is input, the voltages Vcnt and Vmax being input through the first and second input units 11 and 12, respectively. The first and second input units 211 and 212 are selectively activated in response to a maximum frequency determination signal MAX_FREQ, thereby providing one of the voltages Vcnt and Vmax to the positive input terminal of the second operational amplifier OP12. The second operational amplifier OP12 further includes a negative input terminal (−) that is connected to a common node of a source terminal of the NMOS transistor N11 and a second end of the variable resistor R11.

The NMOS transistor N11 of FIG. 2 includes a gate terminal connected to an output terminal of the second operational amplifier OP12, the source terminal connected to the second end of the variable resistor R11, and a drain terminal coupled to the first current mirror circuit 221.

The voltage/current converting circuit 210 of FIG. 2 generates a first current I11 flowing therein using a difference of the voltages Vcnt (or Vmax) and V11, which are applied to the two ends of the variable resistor R11. The first current I11 is determined as follows:

$$I11=(Vcnt-V11)/R11 \quad \text{Equation 3,}$$

wherein R11 represents a resistance of the variable resistor R11, Vcnt represents the control voltage, Vmax represents a maximum voltage for a maximum frequency of the frequency range, and V11 represents the first voltage.

Referring to Equation 3 above, the first voltage V11 has a fixed level, and thus the first current I11 is determined by the control voltage Vcnt and the resistance of the variable resistor R11.

In an embodiment, when the control voltage Vcnt is lower than or equal to the maximum voltage Vmax, the maximum frequency determination signal MAX_FREQ is disabled to deactivate the second input unit 212 and activate the first input unit 211, such that the control voltage Vcnt is input to the positive input terminal of the second operational amplifier OP12.

When the control voltage Vcnt is lower or equal to the first voltage V11, the first current I11 becomes 0 A, i.e., the voltage/current converting circuit 210 of FIG. 2 generates no current.

When the control voltage Vcnt is higher than the first voltage V11 and lower than or equal to the maximum voltage Vmax, the first current I11 is determined as shown in Equation 3 above.

When the control voltage Vcnt is higher than the maximum voltage Vmax, the maximum frequency determination signal MAX_FREQ is enabled to activate the second input unit 212 and deactivate the first input unit 211, such that the maximum voltage Vmax is input to the positive input terminal of the second operational amplifier OP12. At this time, the first current I11 is determined as follows:

$$I11=(Vmax-V11)/R11 \quad \text{Equation 4.}$$

The first current mirror circuit 221 of FIG. 2 is coupled to the voltage/current converting circuit 210 and copies the first current I11 flowing through the voltage/current converting circuit 210 to the second current mirror circuit 222 and the oscillator 206 through a first output node and a second output node of the first current mirror circuit 221, respectively. The first output node of the first current mirror circuit 221 is coupled to the second current mirror circuit 222 of FIG. 2, and the second output node of the first current mirror circuit 221 is coupled to the first node ND1 of the oscillator 206 of FIG. 2.

The first current mirror circuit 221 of FIG. 2 includes three PMOS transistors P11, P12, and P13 that are connected to each other in a current mirror structure. The first PMOS transistor P11 includes a source terminal, which is connected to a supply voltage terminal VDD, and a gate terminal and a drain terminal that are commonly coupled to the drain terminal of the NMOS transistor N11 in the voltage/current converting circuit 210 of FIG. 2. The second PMOS transistor P12 includes a gate terminal connected to the gate terminal of the first PMOS transistor P11 and is coupled between the supply voltage terminal VDD and the first output node of the first current mirror circuit 221. The third PMOS transistor P13 includes a gate terminal connected to the gate terminal of the first PMOS transistor P11 and is coupled between the supply voltage terminal VDD and the second output node of the first current mirror circuit 221. Therefore, the first current mirror circuit 221 provides the first current I11 to the first node ND1 of the oscillator 206 of FIG. 1 through the second output node that is connected to a drain terminal of the third PMOS transistor P13.

The second current mirror circuit 222 of FIG. 2 is coupled to the first current mirror circuit 221 and the oscillator 206, and copies the first current I11 supplied from the first current mirror circuit 221 to an output node that is coupled to the second node ND2 of the oscillator 206. The second current mirror circuit 222 includes two NMOS transistors N12 and N13 that are connected to each other in a current mirror structure. The first NMOS transistor N12 includes a source terminal, which is connected to a ground voltage terminal, and a gate terminal and a drain terminal that are commonly coupled to the first output node of the first current mirror circuit 221 of FIG. 2. The second NMOS transistor N13 includes a gate terminal connected to the gate terminal of the first NMOS transistor N12 and is coupled between the ground voltage terminal and the output node coupled to the second node ND2 of the oscillator 206. The first current I11 flows through the second NMOS transistor N13 coupled to the second node ND2 of the oscillator 206.

Therefore, the first bias current generating circuit 202 of FIG. 2, which includes the voltage/current converting circuit 210 and the first and second current mirror circuits 221 and 222, supplies a first bias current, i.e., the first current I11, to a current path connecting the first and second nodes ND1 and ND2 of the oscillator 206.

The second bias current generating circuit 204 of FIG. 2 is coupled to the first node ND1 and the second node ND2 of the oscillator 206, such that it supplies a second bias current, e.g., Imin, to the current path connecting the first and second nodes ND1 and ND2 of the oscillator 206. The second bias current generating circuit 204 includes a current source 230 and a second current mirror circuit assembly 240. The second current mirror circuit assembly 240 includes a third current mirror circuit 241, and a fourth current mirror sector 242. The current source 230 supplies the second bias current Imin to the third current mirror circuit 241. The third current mirror circuit 241 includes three NMOS transistors N14, N15, and N16 that are connected to each other in a current mirror structure, and receives the second bias current Imin and copies the second bias current Imin to the second node ND2 of the oscillator 206 of FIG. 2 through the NMOS transistor N14 and to the fourth current mirror circuit 242 through the NMOS transistor N15. The fourth current mirror circuit 242 includes two PMOS transistors P14 and P15 that are connected to each other in a current mirror structure, and copies the second bias current Imin from the third current mirror circuit 241 to the first node ND1 of the oscillator 206 through the PMOS transistor P14.

Therefore, the oscillator 206 of FIG. 2 receives, through the first node ND1, the first bias current I11 from the first current mirror circuit 221 of the first bias current generating circuit 202 and the second bias current Imin from the second bias current generating circuit 204. Accordingly, the sourcing current Isrc at the first node ND1 is determined by a sum of the first bias current I11 and the second bias current Imin. In addition, since the second current mirror circuit 222 of the first bias current generating circuit 202 and the third current mirror circuit 241 of the second bias current generating circuit 204 are coupled to the second node ND2 of the oscillator 206, the sinking current Isnk is also determined by a sum of the first bias current I11 flowing through the NMOS transistor N13 of the second current mirror circuit 222 and the second bias current Imin flowing through the NMOS transistor N14 of the third current mirror circuit 241 as follows:

$$Isrc=Isnk=I11+Imin=(Vcnt-V11)/R11+Imin \qquad \text{Equation 5.}$$

As a result, the oscillation frequency f is determined as follows:

$$\begin{aligned} f &= (I11 + Imin)/(2*Cosc*(Vref1 - Vref2)) \qquad \text{Equation 6} \\ &= ((Vcnt - V11)/R11 + Imin)/ \\ &\quad (2*Cosc*(Vref1 - Vref2)). \end{aligned}$$

In order to tune the frequency range of the oscillation frequency f, a minimum frequency and a maximum frequency defining the frequency range should be accurately tuned. Tuning of the minimum frequency and the maximum frequency of the frequency range will be described with reference to Equation 6 above.

As described above, while the level of the first voltage V11, the capacitance of the capacitor Cosc, and the levels of the first and second reference voltages Vref1 and Vref2 are predetermined or fixed, the second bias current Imin, the level of the control voltage Vcnt, and the resistance of the resistor R11 are adjustable. Therefore, referring to Equation 6 above, the minimum frequency and the maximum frequency can be tuned by properly controlling the sum of the first current I11 and the second bias current Imin using the variable resistor R11 and the current source 230.

Figure 4:
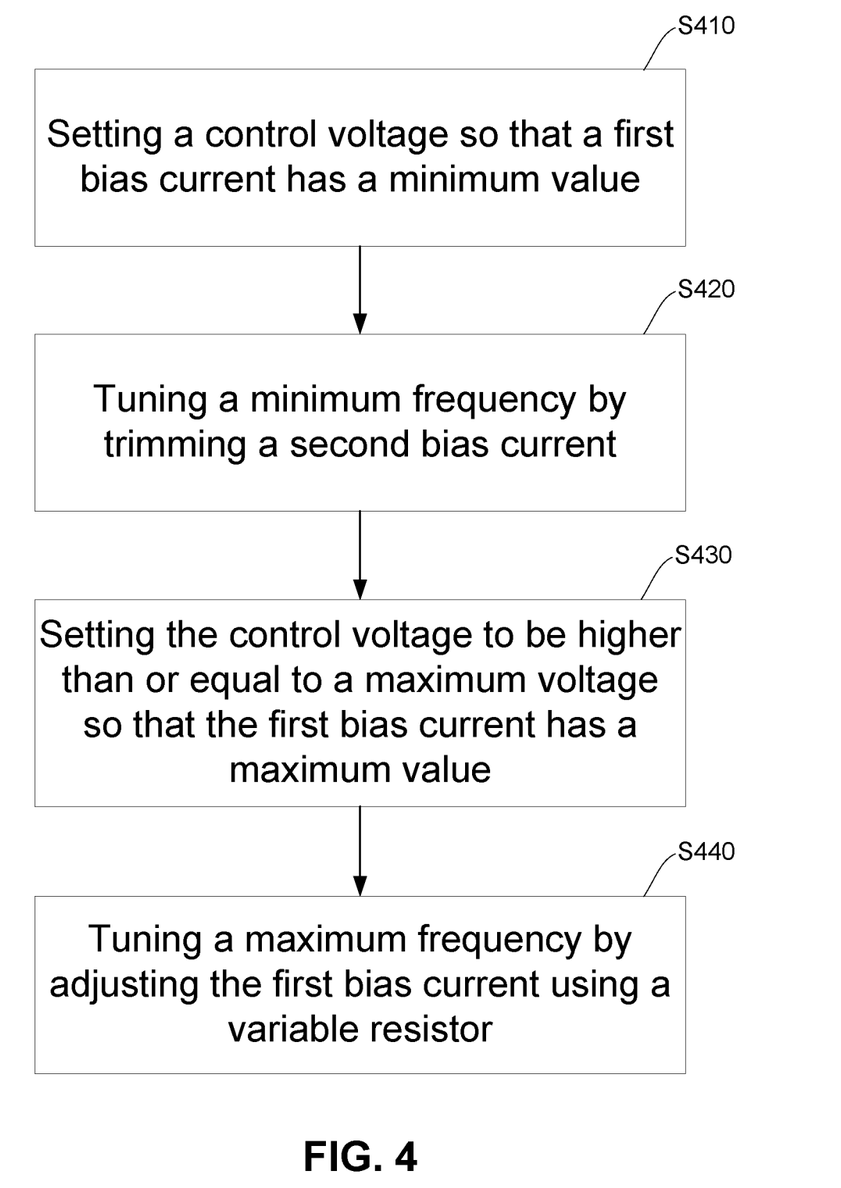
FIG. 4 illustrates a process for tuning a frequency range of the oscillator circuit of FIG. 3 according to an embodiment.

FIG. 4 illustrates a process 400 for tuning a frequency range of the oscillator circuit 200 of FIG. 2 according to an embodiment.

Since a minimum frequency Fmin of the frequency range is determined when the sum of the first bias current I11 and the second bias current Imin has a minimum value, at S410, the control voltage Vcnt is set to be lower than or equal to the first fixed voltage V11 so that the first bias current I11 has a minimum value, e.g., 0 A.

At S420, the minimum frequency Fmin of the frequency range is tuned by trimming the second bias current Imin. The second bias current Imin is trimmed by controlling the current source 230 in the second bias current generating circuit 204 of FIG. 2.

When the control voltage Vcnt is adjusted to be substantially equal to the first voltage V11 and thus the first current I11 becomes 0 A, the minimum frequency Fmin is determined as follows:

$$Fmin=(Imin)/(2*Cosc*(Vref1-Vref2)) \qquad \text{Equation 7.}$$

That is, in an embodiment, the minimum frequency Fmin is tuned by trimming only the second bias current Imin using the current source 230 in the second bias current generating circuit 204 of FIG. 2.

At S430, since a maximum frequency Fmax of the frequency range is determined when the sum of the first bias current I11 and the second bias current Imin has a maximum value, the control voltage Vcnt is set to the maximum voltage Vmax so that the first bias current I11 has a maximum value. The maximum value of the first bias current I11 may be obtained by maximizing a voltage (Vcnt−V11). At this time, the second bias current Imin has a fixed value since its value is set when tuning the minimum frequency Fmin at S420.

When the control voltage Vcnt is adjusted to be substantially equal to the maximum voltage Vmax, the maximum frequency Fmax is determined as follows:

$$\begin{aligned} f &= (I11 + Imin)/(2*Cosc*(Vref1 - Vref2)) \qquad \text{Equation 8} \\ &= ((Vcnt - V11)/R11 + Imin)/ \\ &\quad (2*Cosc*(Vref1 - Vref2)) \\ &= ((Vmax - V11)/R11 + Imin)/ \\ &\quad (2*Cosc*(Vref1 - Vref2)). \end{aligned}$$

In an embodiment, since the second bias current Imin has a significantly smaller value compared to the first bias current I11, i.e., I11>>Imin, the second bias current Imin may be ignored.

At S440, the maximum frequency Fmax is tuned by adjusting the first bias current I11 that corresponds to (Vmax−V11)/R11. Since the first voltage V11 is fixed, the first bias current I11 is adjusted by controlling the control voltage Vcnt and the resistance of the variable resistor R11. When tuning the maximum frequency Fmax, the control voltage Vcnt is set to the maximum voltage Vmax corresponding to the maximum frequency Fmax at S430. Therefore, at S440, the maximum frequency Fmax is tuned by adjusting only the resistance of the variable resistor R11.

As explained above, the minimum frequency Fmin is tuned by trimming the second bias current Imin when the first bias current I11 is set to be 0 A by adjusting the control voltage Vcnt to be lower than or equal to the first voltage V11. After the minimum frequency Fmin is tuned, the maximum frequency Fmax is tuned by trimming the resistance of the variable resistor R11 when the first bias current I11 is set to the maximum value by adjusting the control voltage Vcnt to be higher than or equal to the maximum voltage Vmax.

During S430, when the control voltage Vcnt is adjusted to be higher than the maximum voltage Vmax, since the maximum frequency determination signal MAX_FREQ is enabled to activate the second input unit 212 of FIG. 2 and deactivate the first input unit 211 of FIG. 2, the maximum voltage Vmax is input to the positive input terminal of the second operational amplifier OP12 of FIG. 2. Therefore, the maximum frequency Fmax is accurately tuned by the variable resistor R11 even though the control voltage Vcnt becomes higher than the maximum voltage Vmax. The second bias current Imin and the resistance of the variable resistor R11 are fixed after tuning the minimum frequency Fmin and the maximum frequency Fmax. After the frequency range is tuned, the oscillator circuit 200 of FIG. 2 generates the pulse signal that has the oscillation frequency f varying within the frequency range according to the control voltage Vcnt.

Figure 5:
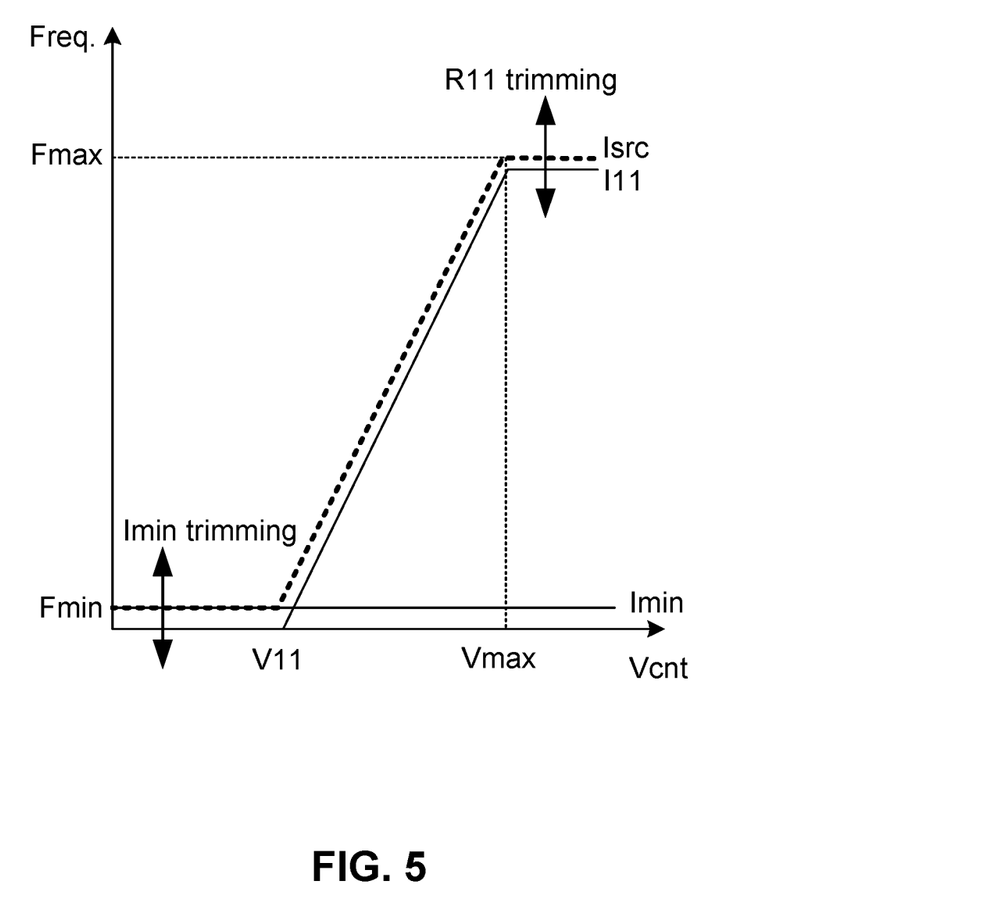
FIG. 5 illustrates a frequency tuning operation of the oscillator circuit of FIG. 2 according to an embodiment.

FIG. 5 illustrates a frequency tuning operation of the oscillator circuit 200 of FIG. 2 according to an embodiment. As shown, when the control voltage Vcnt is set to be lower than or equal to the first voltage V11, the minimum frequency Fmin is tuned by trimming the second bias current Imin using the current source 230 in the second bias current generating circuit 204 of FIG. 2. When the control voltage Vcnt is set to be higher than or equal to the maximum voltage Vmax, the maximum frequency Fmax is tuned by trimming the resistance of the variable resistor R11 in the first bias current generating circuit 202 of FIG. 2.

After the frequency range is tuned by the minimum frequency Fmin and the maximum frequency Fmax, an oscillation frequency of the pulse signal output from the oscillator 206 of FIG. 2 is set to be between the minimum frequency Fmin and the maximum frequency Fmax according to a variation of the control voltage Vcnt.

As described above, since the minimum frequency Fmin is tuned by trimming the second bias current Imin and the maximum frequency Fmax is tuned by trimming the resistance of the variable resistor R11, the minimum frequency Fmin and the maximum frequency Fmax are independently tuned, such that it is possible to accurately tune the minimum frequency Fmin and the maximum frequency Fmax. In addition, since the second bias current Imin can be adjusted with the size of transistor(s) forming the current source 230, the minimum frequency Fmin can be precisely tuned.

Referring to FIG. 5, in the above embodiment, an intermediate frequency within the frequency range varies along a single slope that is determined by (Vcnt−V11)/R11. However, embodiments are not limited thereto. In other embodiments, the intermediate frequency may vary along a sum of multiple slopes according to the control voltage Vcnt.

Figure 6:
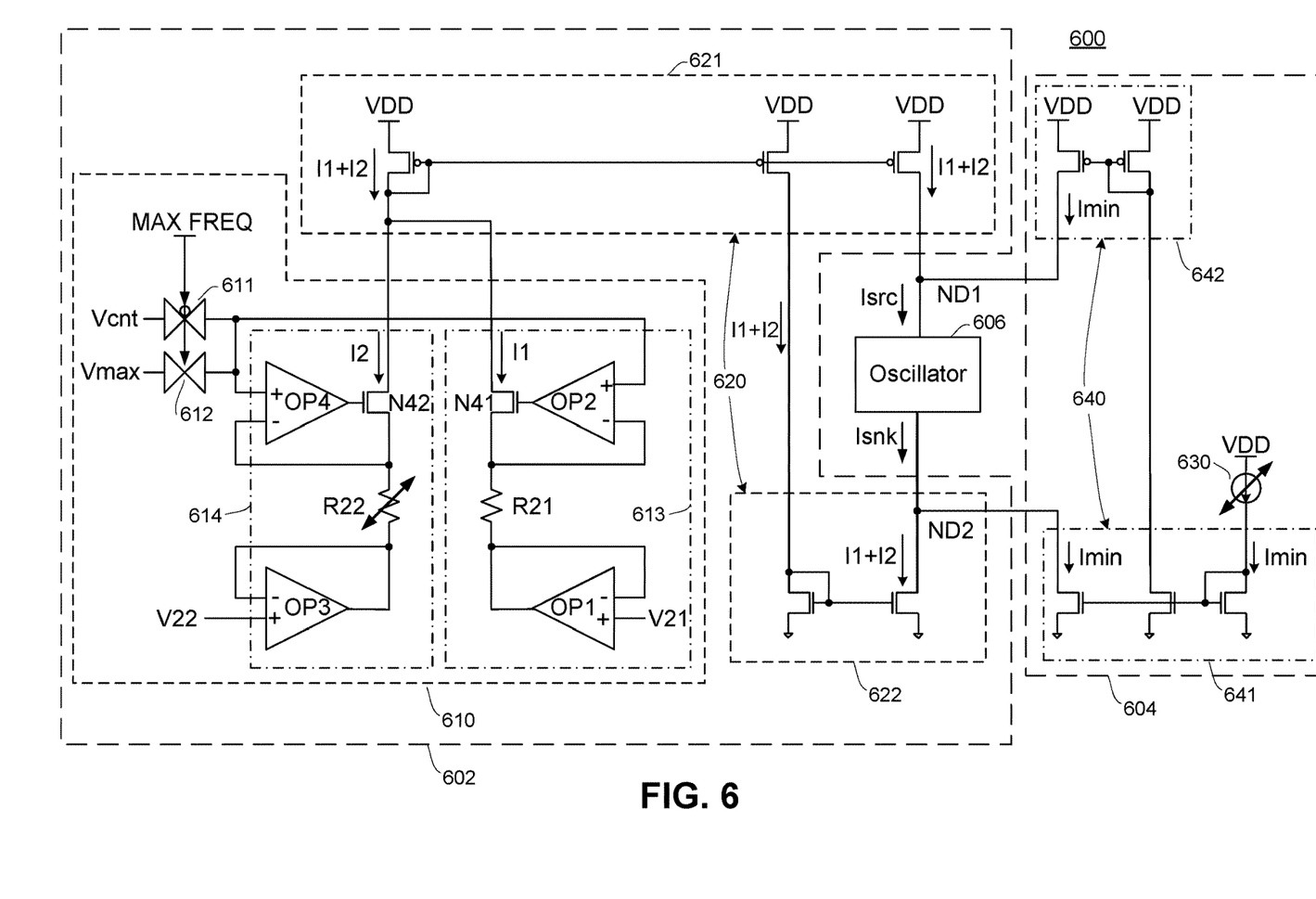
FIG. 6 illustrates an oscillator circuit according to another embodiment.

FIG. 6 illustrates an oscillator circuit 600 according to another embodiment. The oscillator circuit 600 generates a pulse signal that has an oscillation frequency f varying, within a frequency range, along a sum of multiple slopes, e.g., two slopes.

The oscillator circuit 600 of FIG. 6 includes a first bias current generating circuit 602, a second bias current generating circuit 604, and an oscillator 606. The first bias current generating circuit 602 includes a voltage/current converting circuit 610 and a first current mirror circuit assembly 620. The first current mirror circuit assembly 620 includes first and second current mirror circuits 621 and 622. Since the first current mirror circuit 621, the second current mirror circuit 622, the second bias current generating circuit 604, and the oscillator 606 may have substantially the same configurations as the first current mirror circuit 221, the second current mirror circuit 222, the second bias current generating circuit 204, and the oscillator 206 of FIG. 2, respectively, the detailed descriptions thereof are omitted for the simplicity of explanation.

Similar to the embodiment shown in FIG. 2, the first bias current generating circuit 602 and the second bias current generating circuit 604 of FIG. 6 collectively control levels of a sourcing current Isrc and a sinking current Isnk, which form a current path through the oscillator 606, such that the oscillation frequency f of the pulse signal output from the oscillator circuit 600 of FIG. 6 is determined based on the sourcing current Isrc and the sinking current Isnk.

In this embodiment, the voltage/current converting circuit 602 of FIG. 6 includes a first voltage/current converting sector 613, a second voltage/current converting sector 614, a first input unit 611, and a second input unit 612. The first voltage/current converting sector 613 includes a first operational amplifier OP1, a second operational amplifier OP2, a resistor R21 having a fixed resistance, and an NMOS transistor N41. The second voltage/current converting sector 614 includes a third operational amplifier OP3, a fourth operational amplifier OP4, a variable resistor R22, and an NMOS transistor N42. The first voltage/current converting sector 613 and the second voltage/current converting sector 614 are coupled in parallel to each of the first current mirror circuit 621 and the first and second input units 611 and 612.

In the first voltage/current converting sector 613 of FIG. 6, the first operational amplifier OP1 includes a positive input terminal (+) and a negative input terminal (−). The positive input terminal receives a first voltage V21 having a fixed level. The negative input terminal is connected to a common node of a first end of the fixed resistor R21 and an output terminal of the first operational amplifier OP1. The second operational amplifier OP2 includes a positive input terminal (+) through which one of voltages Vcnt and Vmax is input, the voltages Vcnt and Vmax being provided via the first and second input units 611 and 612, respectively. The first and second input units 611 and 612 are selectively activated in response to a maximum frequency determination signal MAX_FREQ, thereby providing one of the voltages Vcnt and Vmax to the positive input terminal of the second operational amplifier OP2. The second operational amplifier OP2 further includes a negative input terminal (−) that is connected to a common node of a source terminal of the NMOS transistor N41 and a second end of the resistor R21. The NMOS transistor N41 includes a gate terminal connected to an output terminal of the second operational amplifier OP2, the source terminal connected to the second end of the resistor R21, and a drain terminal coupled to the first current mirror circuit 621 of FIG. 6.

The second voltage/current converting sector 614 of FIG. 6 has substantially the same configuration as a corresponding portion of the voltage/current converting circuit 210 shown in FIG. 2. That is, the third operational amplifier OP3 includes a positive input terminal (+) and a negative input terminal (−). The positive input terminal receives a second voltage V22 having a fixed level. The negative input terminal is connected to a common node of a first end of the variable resistor R21 and an output terminal of the third operational amplifier OP3 Like the second operational amplifier OP2 of the first voltage/current converting sector 613, the fourth operational amplifier OP4 includes a positive input terminal (+) through which one of the voltages Vcnt and Vmax is input according to the operations of the first and second input units 611 and 612. The fourth operational amplifier OP4 further includes a negative input terminal (−) that is connected to a common node of a source terminal of the NMOS transistor N42 and a second end of the variable resistor R22. The NMOS transistor N42 includes a gate terminal connected to an output terminal of the fourth operational amplifier OP4, the source terminal connected to the second end of the variable resistor R22, and a drain terminal coupled to the first current mirror circuit 621 of FIG. 6.

The first voltage/current converting sector 613 of the voltage/current converting circuit 610 of FIG. 6 generates a first current I1 flowing therein using a difference of voltages Vcnt (or Vmax) and V21, which are applied to the two ends of the fixed resistor R21. The first current I1 is determined as follows:

$$I1 = (Vcnt - V21)/R21 \qquad \text{Equation 9,}$$

wherein R21 represents the fixed resistance of the resistor R21, Vcnt represents the control voltage, Vmax represents a maximum voltage for determining a maximum frequency of the frequency range, and V21 represents the first voltage. Since the first voltage V21 has a fixed level and the resistor R21 has a fixed resistance, the first current I1 varies depending on the control voltage Vcnt.

Similarly, the second voltage/current converting sector 614 of the voltage/current converting circuit 610 of FIG. 6 generates a second current I2 flowing therein using a difference of voltages Vcnt (or Vmax) and V22, which are applied to the two ends of the variable resistor R22. The second current I2 is determined as follows:

$$I2=(Vcnt-V22)/R22 \quad \text{Equation 10,}$$

wherein R22 represents a variable resistance of the variable resistor R22, and V22 represents the second voltage. Therefore, the second current I2 varies depending on the control voltage Vcnt and the variable resistance of the variable resistor R22 since the second voltage V22 is fixed. In an embodiment, the second fixed voltage V22 is higher than the first fixed voltage V21.

As described above, the voltage/current converting circuit 610 of FIG. 6 generates a first bias current corresponding to a sum of the first current I1 and the second current I2.

In particular, similar to the description relating to FIG. 2, while the control voltage Vcnt is lower than or equal to the maximum voltage Vmax, the maximum frequency determination signal MAX_FREQ is disabled to deactivate the second input unit 612 and activate the first input unit 611, such that the control voltage Vcnt is input to the positive input terminal of the second and fourth operational amplifiers OP2 and OP4.

When the control voltage Vcnt is lower or equal to the first fixed voltage V21, the sum of the first current I1 and the second current I2 becomes a minimum current of 0 A, i.e., the voltage/current converting circuit 610 of FIG. 6 generates no current.

When the control voltage Vcnt is higher than the first fixed voltage V21 and lower than or equal to the second fixed voltage V22, the first current I1 flows through the first voltage/current converting sector 613 including the NMOS transistor N41 and the resistor R21. At this time, the second current I2 still does not flow through the second voltage/current converting sector, as can be seen from Equation 10, since the second fixed voltage V22 is higher than the first fixed voltage V21.

When a level of the control voltage Vcnt gradually increases and thus the control voltage Vcnt becomes higher than the second fixed voltage V22 and lower than or equal to the maximum voltage Vmax, the second current I2 flows through the second voltage/current converting sector 614 including the NMOS transistor N42 and the variable resistor R22.

As a result, the voltage/current converting circuit 610 of FIG. 6 generates the first bias current corresponding to the sum of the first current I1 and the second current I2.

$$I1+I2=(Vcnt-V21)/R21+(Vcnt-V22)/R22 \quad \text{Equation 11.}$$

When the control voltage Vcnt is higher than the maximum voltage Vmax, the maximum frequency determination signal MAX_FREQ is enabled to activate the second input unit 612 and deactivate the first input unit 611 of FIG. 6, such that the maximum voltage Vmax is input to the positive input terminal of the second and fourth operational amplifiers OP2 and OP4. The voltage/current converting circuit 610 generates the first bias current having a maximum value that is determined as follows:

$$I1+I2=(Vmax-V21)/R21+(Vmax-V22)/R22 \quad \text{Equation 12.}$$

Similar to the first current mirror circuit 221 of FIG. 2, the first current mirror circuit 621 of FIG. 6 is coupled to the voltage/current converting circuit 610 of FIG. 6, and copies the first bias current I1+I2 flowing through the voltage/current converting circuit 610 to a first output node and a second output node of the first current mirror circuit 621. The first output node of the first current mirror circuit 621 is coupled to the second current mirror circuit 622, and the second output node of the first current mirror circuit 621 is coupled to a first node ND1 of the oscillator 606 of FIG. 6. Therefore, the first bias current I1+I2 is provided to the second current mirror circuit 622 through the first output node of the first current mirror circuit 621 and to the first node ND1 of the oscillator 606 through the second output node of the first current mirror circuit 621.

Similar to the second current mirror circuit 222 of FIG. 2, the second current mirror circuit 622 of FIG. 6 copies the first bias current I1+I2 supplied from the first current mirror circuit 621 to the second node ND2 of the oscillator 606.

Therefore, the first bias current generating circuit 602 of FIG. 6, which includes the voltage/current converting circuit 610 and the first and second current mirror circuits 621 and 622, supplies the first bias current I1+I2 to a current path connecting the first and second nodes ND1 and ND2 of the oscillator 606.

Similar to the second bias current generating circuit 204 of FIG. 2, the second bias current generating circuit 604 of FIG. 6 includes a current source 630 and a second current mirror circuit assembly 640. The second current mirror circuit assembly 640 includes a third current mirror circuit 641 and a fourth current mirror circuit 642. The second bias current generating circuit 604 generates and supplies a second bias current Imin to the current path connecting the first and second nodes ND1 and ND2 of the oscillator 606.

Therefore, the oscillator 606 of FIG. 6 receives, through the first node ND1, the first bias current I1+I2 from the first current mirror circuit 621 of the first bias current generating circuit 602 and the second bias current Imin from the fourth current mirror circuit 642 of the second bias current generating circuit 604. The sourcing current Isrc is determined by a sum of the first bias current I1+I2 and the second bias current Imin. In addition, since the second current mirror circuit 622 of the first bias current generating circuit 602 and the third current mirror circuit 641 of the second bias current generating circuit 604 are coupled to the second node ND2 of the oscillator 606, the sinking current Isnk is also determined by a sum of the first bias current I1+I2 and the second bias current Imin as follows.

$$Isrc=Isnk=I1+I2+Imin \quad \text{Equation 13.}$$

As a result, the oscillation frequency f is determined as follows:

$$f=(I1+I2+Imin)/(2*Cosc*(Vref1-Vref2)) \quad \text{Equation 14.}$$

Therefore, in order to tune the frequency range of the oscillation frequency f, a minimum frequency and the maximum frequency defining the frequency range should be accurately tuned. Tuning of the minimum frequency and the maximum frequency will be described with reference to Equation 14 above.

As described above, while a level of the first fixed voltage V21, a level of the second fixed voltage V22, the resistance of the resistor R21, the capacitance of the capacitor Cosc, and the levels of the first and second reference voltages Vref1 and Vref2 are fixed, the second bias current Imin and the resistance of the variable resistor R22 are adjustable. Therefore, referring to Equations 11 and 14 above, the minimum frequency and the maximum frequency can be tuned by properly controlling the sum of the first bias current I1+I2 and the second bias current Imin.

First of all, the minimum frequency Fmin is tuned when the sum of the first bias current I1+I2 and the second bias current Imin has a minimum value. A minimum value of the first bias current I1+I2 may be obtained by setting the first bias current I1+I2 to 0 A, i.e., by setting the control voltage Vcnt to be lower to equal to the first fixed voltage V21. When the control voltage Vcnt is adjusted to be lower than or equal to the first fixed voltage V21 and thus the first bias current I1+I2 becomes 0 A, the minimum frequency Fmin is determined as follows:

$$Fmin=(Imin)/(2*Cosc*(Vref1-Vref2))$$ Equation 15.

That is, the minimum frequency Fmin is tuned by trimming only the second bias current Imin using the current source 630 included in the second bias current generating circuit 604 of FIG. 6.

Meanwhile, the maximum frequency Fmax is tuned when the sum of the first bias current I1+I2 and the second bias current Imin has a maximum value. A maximum value of the first bias current I1+I2 may be obtained by maximizing a sum of (Vcnt-V22) and (Vcnt-V21), referring to Equations 9 and 10 above. When the control voltage Vcnt is adjusted to be higher than or equal to the maximum voltage Vmax, the maximum frequency Fmax is determined as follows:

$$\begin{aligned}Fmax &= (I1+I2+Imin)/(2*Cosc* \\ &\quad (Vref1-Vref2)) \\ &= ((Vmax-V21)/R21 + \\ &\quad (Vmax-V22)/R22+Imin)/ \\ &\quad (2*Cosc*(Vref1-Vref2)).\end{aligned}$$ Equation 16

In an embodiment, since the second bias current Imin has a significantly small value compared to the first bias current I1+I2, i.e., I1+I2>>Imin, the second bias current Imin may be ignored. Therefore, the maximum frequency Fmax may be tuned by adjusting the first bias current I1+I2 that is (Vmax-V21)/R21+(Vmax-V22)/R22. While the first current I1 is fixed since the voltages Vmax and V22 and the resistance of the resistor R21 are fixed, the second current I2 is adjustable by the resistance of the variable resistor R22. Therefore, when tuning the maximum frequency Fmax, the control voltage Vcnt is set to the maximum voltage Vmax corresponding to the maximum frequency Fmax, and thus the maximum frequency Fmax is tuned by trimming the resistance of the variable resistor R22.

As explained above, the minimum frequency Fmin is tuned by trimming the second bias current Imin when the first bias current I1+I2 is set to 0 A by adjusting the control voltage Vcnt to be lower than or equal to the first voltage V21. After the minimum frequency Fmin is tuned, the maximum frequency Fmax is tuned by trimming the resistance of the variable resistor R22 when the first bias current I1+I2 is set to the maximum value by adjusting the control voltage Vcnt to be higher than or equal to the maximum voltage Vmax.

When the control voltage Vcnt becomes higher than the maximum voltage Vmax, since the maximum frequency determination signal MAX_FREQ is enabled to activate the second input unit 612 and deactivate the first input unit 611 in the first bias current generating circuit 602, the maximum voltage Vmax is input to the positive input terminals of the second and fourth operational amplifiers OP2 and OP4. Therefore, the maximum frequency Fmax is accurately tuned by the variable resistor R22 even though the control voltage Vcnt becomes higher than the maximum voltage Vmax. The second bias current Imin and the resistance of the variable resistor R22 are fixed after tuning the minimum frequency Fmin and the maximum frequency Fmax. After the frequency range is tuned, the oscillator circuit 600 of FIG. 6 generates the pulse signal that has the oscillation frequency f varying within the frequency range according to the control voltage Vcnt.

Figure 7:
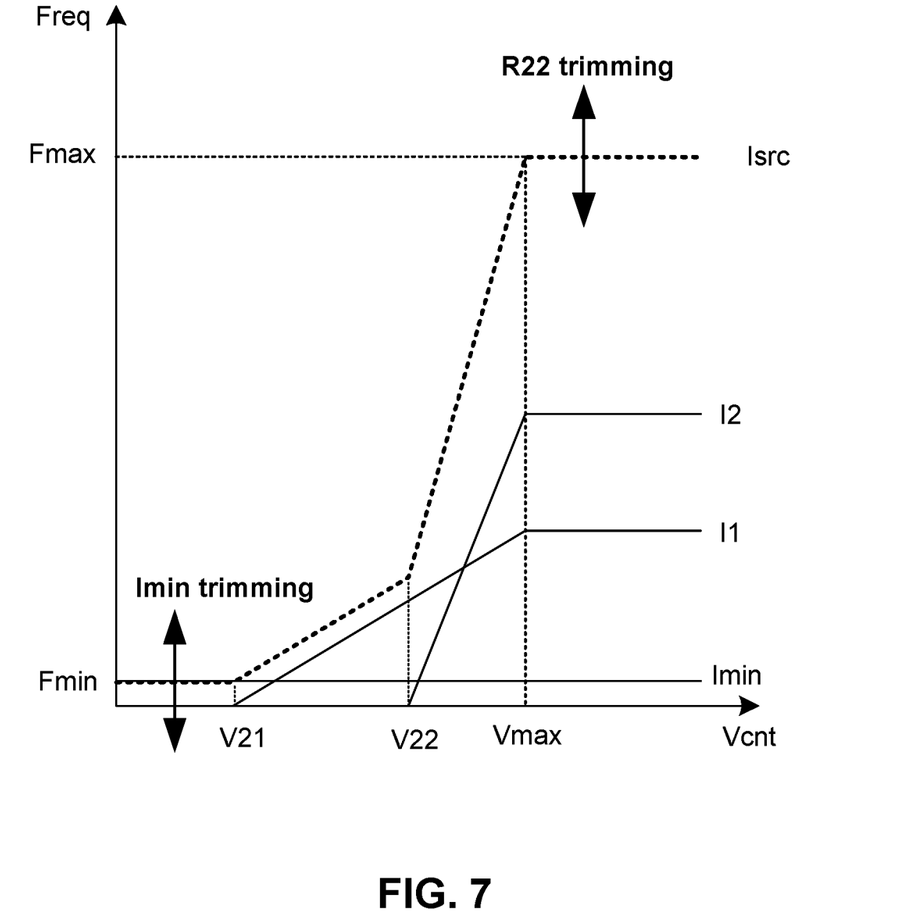
FIG. 7 illustrates a frequency tuning operation of the oscillator circuit of FIG. 6 according to an embodiment.

FIG. 7 illustrates a frequency tuning operation of the oscillator circuit 600 of FIG. 6 according to an embodiment. As shown, when the control voltage Vcnt is set to be lower than or equal to the first voltage V21, the minimum frequency Fmin is tuned by trimming the second bias current Imin using the current source 630 in the second bias current generating circuit 604 of FIG. 6. When the control voltage Vcnt is set to be higher than or equal to the maximum voltage Vmax, the maximum frequency Fmax is tuned by trimming the resistance of the variable resistor R22 in the first bias current generating circuit 602 of FIG. 6.

After the frequency range is defined by tuning the minimum frequency Fmin and the maximum frequency Fmax, an oscillation frequency of the pulse signal output from the oscillator 606 of FIG. 6 may be determined between the minimum frequency Fmin and the maximum frequency Fmax according to a variation of the control voltage Vcnt.

In the embodiment shown in FIG. 6, the voltage/current converting circuit 610 of the first bias current generating circuit 602 includes the first voltage/current converting sector 613 generating the first current I1 corresponding to (Vcnt-V21)/R21 and the second voltage/current converting sector 614 generating the second current I2 corresponding to (Vcnt-V22)/R22. Therefore, as shown in FIG. 7, when the control voltage Vcnt is between the first fixed voltage V21 and the second fixed voltage V22, an intermediate frequency varies along a first slope that is determined by (Vcnt-V21)/R21 since, at this time, the second current I2 is 0 A. When the control voltage Vcnt is between the second fixed voltage V22 and the maximum voltage Vmax, the intermediate frequency varies along a sum of the first slope and a second slope, the second slop being determined by (Vcnt-V22)/R22).

FIG. 6 shows the voltage/current converting circuit 610 that includes the first and second voltage/current converting sectors 613 and 614, and thus FIG. 7 shows the oscillation frequency f varying along two slopes. However, embodiments are not limited thereto. In other embodiments, a voltage/current converting circuit in a first bias current generating circuit may include more than two voltage/current converting sectors connected in parallel to each other, and thus the frequency f varies along a sum of more than two slopes. For example, when a voltage/current converting circuit includes three voltage/current converting sectors, a third voltage/current converting sector, which receives a third fixed voltage and includes a third resistor having a fixed resistance, may be coupled in parallel to the first and second voltage/current converting sectors in the voltage/current converting circuit 610 of FIG. 6. As a result, the frequency f can vary along a sum of three slopes as a level of the control voltage Vcnt changes. The third voltage/current converting sector may have the same configuration as the first voltage/current converting sector 613 of the voltage/current converting circuit 610 of FIG. 6. However, the third fixed voltage and the third resistor may have different values from those of the voltage V21 and the resistor R21, respectively.

As described above, in the embodiment described with reference to FIGS. 6 and 7, since the minimum frequency Fmin is tuned by trimming the second bias current Imin and the maximum frequency Fmax is tuned by trimming the resistance of the variable resistor R22, the minimum frequency Fmin and the maximum frequency Fmax are independently tuned, such that it is possible to accurately and precisely tune the minimum frequency Fmin and the maximum frequency Fmax.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An oscillator circuit, comprising:
an oscillator having a source node and a sink node, the oscillator being configured to generate a pulse signal having an output voltage that corresponds to a charging or discharging operation of a capacitor;
a first bias current generating circuit coupled to the source and the sink nodes of the oscillator and configured to supply a first bias current to the oscillator, the first bias current being adjustable; and
a second bias current generating circuit coupled to the source and the sink nodes of the oscillator and configured to supply a second bias current to the oscillator, the second bias current being adjustable,
wherein the first bias current and the second bias current are used to tune a frequency range of the oscillator, and
wherein the first bias current generating circuit comprises:
a variable resistor including a first end and a second end;
a first operational amplifier receiving a fixed voltage at a positive input terminal, the fixed voltage having a fixed level, a negative input terminal and an output terminal of the first operational amplifier being coupled to the second end of the variable resistor;
a second operational amplifier receiving a control voltage at a positive input terminal, a negative input terminal of the second operational amplifier being coupled to the first end of the variable resistor; and
an NMOS transistor including a gate terminal coupled to an output terminal of the second operational amplifier, a source terminal coupled to the first end of the variable resistor, and a drain terminal to which the first bias current is generated.

2. The oscillator circuit of claim 1, wherein the charging or discharging operation of the capacitor is performed through a current path formed by a sourcing current and a sinking current, the sourcing current being supplied to the oscillator through the source node, the sinking current sinking from the oscillator through the sink node, and
wherein each of the sourcing current and the sinking current is determined by a current sum of the first bias current and the second bias current.

3. The oscillator circuit of claim 2, wherein the first bias current generating circuit further comprises:
a current mirror circuit assembly coupled to the drain terminal of the NMOS transistor and configured to copy the first bias current to the current path of the oscillator.

4. The oscillator circuit of claim 3, wherein the pulse signal has an oscillation frequency varying in the frequency range, and
wherein the first bias current generating circuit further comprises:
an input unit configured to provide a maximum voltage to the first bias current generating circuit when a level of the control voltage exceeds the maximum voltage, the maximum voltage corresponding to a maximum frequency of the frequency range.

5. The oscillator circuit of claim 3, wherein the fixed voltage is a first fixed voltage, and the NMOS transistor is a first NMOS transistor,
wherein the first bias current generating circuit further comprises:
a fixed resistor having a fixed resistance and including a first end and a second end;
a third operational amplifier receiving a second fixed voltage at its positive input terminal, the second fixed voltage having a fixed level, a negative input terminal and an output terminal of the third operational amplifier being coupled to the second end of the fixed resistor;
a fourth operational amplifier receiving the control voltage at its positive input terminal, a negative input terminal of the fourth operational amplifier being coupled to the first end of the fixed resistor; and
a second NMOS transistor including a gate terminal coupled to an output terminal of the fourth operational amplifier, a source terminal coupled to the first end of the fixed resistor, and a drain terminal coupled to the drain terminal of the first NMOS transistor,
wherein the first bias current is a sum of a first current and a second current, the first current flowing through the first NMOS transistor, the second current flowing through the second NMOS transistor, and
wherein the first fixed voltage has a greater level than the second fixed voltage.

6. The oscillator circuit of claim 3, wherein the current mirror circuit assembly comprises:
a first current mirror circuit configured to copy the first bias current to a first output node and a second output node;
a second current mirror circuit configured to copy the first bias current to the sink node of the oscillator,
wherein the first output node of the first current mirror circuit is coupled to an input node of the second current mirror circuit, and the second output node of the first current mirror circuit is coupled to the source node of the oscillator.

7. The oscillator circuit of claim 6, wherein the first current mirror circuit comprises:
a first PMOS transistor including a source terminal coupled to a supply voltage terminal and a gate terminal and a drain terminal that are coupled to the drain terminal of the NMOS transistor;
a second PMOS transistor including a gate terminal coupled to the gate terminal of the first PMOS transistor, a source terminal coupled to the supply voltage terminal, and a drain terminal coupled to the first output node of the first current mirror circuit; and
a third PMOS transistor including a gate terminal coupled to the gate terminals of the first and second PMOS transistors, a source terminal coupled to the supply voltage terminal, and a drain terminal coupled to the second output node of the first current mirror circuit.

8. The oscillator circuit of claim 1, wherein the second bias current generating circuit comprises:
a current source configured to provide the second bias current;
a first current mirror circuit configured to copy the second bias current to a first output node and a second output node;
a second current mirror circuit configured to copy the second bias current to the source node of the oscillator, wherein the first output node of the first current mirror circuit is coupled to an input node of the second current mirror circuit, and the second output node of the first current mirror circuit is coupled to the sink node of the oscillator.

9. The oscillator circuit of claim 8, wherein the first current mirror circuit comprises:
   a first NMOS transistor including a source terminal coupled to a ground voltage terminal and a gate terminal and a drain terminal that are coupled to the current source;
   a second NMOS transistor including a gate terminal coupled to the gate terminal of the first NMOS transistor, a source terminal coupled to the ground voltage terminal, and a drain terminal coupled to the first output node of the first current mirror circuit; and
   a third NMOS transistor including a gate terminal coupled to the gate terminals of the first and second NMOS transistors, a source terminal coupled to the ground voltage terminal, and a drain terminal coupled to the second output node of the first current mirror circuit.

10. The oscillator circuit of claim 1, wherein the oscillator includes a saw-tooth oscillator.

11. The oscillator circuit of claim 1, wherein the oscillator comprises:
    a first comparator configured to receive a voltage of the capacitor at a positive input terminal, and receive a first reference voltage at a negative input terminal;
    a second comparator configured to receive a second reference voltage at a positive input terminal, and receive the capacitor voltage at a negative input terminal;
    an RS flip-flop configured to receive an output signal of the first comparator at a reset input terminal, receive an output signal of the second comparator at a set input terminal, and output the pulse signal of the oscillator; and
    a feedback switching circuit coupled to and disposed between the source node and the sink node of the oscillator and configured to control the charging or discharging operation of the capacitor by a feedback of the pulse signal,
    wherein the first reference voltage and the second reference voltage determine a swing width of the voltage of the capacitor.

12. The oscillator circuit of claim 11, wherein the feedback switching circuit comprises:
    a first switch coupled to and disposed between the source node and the capacitor and configured to charge the capacitor in response to the pulse signal; and
    a second switch coupled to and disposed between the capacitor and the sink node and configured to discharge the capacitor in response to the pulse signal.

13. The oscillator circuit of claim 1, wherein the pulse signal has an oscillation frequency varying, in the frequency range, according to the control voltage after the oscillator circuit is tuned to determine the frequency range.

14. The oscillator circuit of claim 13, wherein the frequency range is defined by a first frequency and a second frequency,
    wherein the first frequency is tuned by trimming the second bias current using a current source in the second bias current generating circuit when the control voltage is set so that the first bias current has a minimum value, and
    wherein, after the first frequency is tuned, the second frequency is tuned by trimming a resistance of Hall the variable resistor in the first bias current generating circuit when the control voltage is set so that the first bias current has a maximum value.

15. The oscillator circuit of claim 14, wherein the first frequency and the second frequency correspond to a minimum frequency and a maximum frequency of the frequency range, respectively, and
    wherein, when the second frequency is tuned, the control voltage is set to be higher than or equal to a maximum voltage corresponding to the maximum frequency.

16. A method for tuning a frequency range of an oscillator, the method comprising:
    setting a control voltage to cause a first bias current to have a minimum value, the first bias current being generated by a voltage/current generating converting circuit of an oscillator circuit based on the control voltage and a resistance of a variable resistor;
    tuning a first frequency by trimming a second bias current when the first bias current has the minimum value, the second bias current being generated by adjusting a current source of the oscillator circuit;
    setting the control voltage so that the first bias current has a maximum value; and
    tuning a second frequency by trimming the resistance of the variable resistor of the oscillator circuit when the first bias current has the maximum value,
    wherein the frequency range is defined by the first frequency and the second frequency,
    wherein a sum of the first bias current and the second bias current is supplied to a current path in the oscillator, and
    wherein each of a source current and a sink current of the oscillator is determined by the sum of the first bias current and the second bias current, the source current and the sink current forming the current path in the oscillator.

17. The method of claim 16, wherein the first frequency and the second frequency correspond to a minimum frequency and a maximum frequency of the frequency range, respectively, and
    wherein, when the second frequency is tuned, the control voltage is set to be higher than or equal to a maximum voltage corresponding to the maximum frequency.

18. An integrated circuit device comprising an oscillator circuit, wherein the oscillator circuit comprises:
    an oscillator having a source node and a sink node, the oscillator being configured to generate a pulse signal having an output voltage that corresponds to a charging or discharging operation of a capacitor;
    a first bias current generating circuit including a variable resistor and coupled to the source and the sink nodes of the oscillator, the first bias current generating circuit configured to supply a first bias current to the oscillator, the first bias current being adjustable by controlling a control voltage and a resistance of the variable resistor; and
    a second bias current generating circuit including a current source and coupled to the source and the sink nodes of the oscillator, the second bias current generating circuit configured to supply a second bias current to the oscillator, the second bias current being adjustable by controlling the current source,
    wherein the first bias current and the second bias current are used to tune a frequency range of the oscillator that is defined by a first frequency and a second frequency, wherein the first frequency is tuned by trimming the second bias current using the current source when the control voltage is set so that the first bias current has a minimum value, and wherein, after the first frequency is tuned, the second frequency is tuned by trimming the resistance of the variable resistor when the control voltage is set so that the first bias current has a maximum value.

19. The integrated circuit of claim 18, wherein the charging or discharging operation is performed through a current path formed by a sourcing current and a sinking current, the sourcing current being supplied to the oscillator through the source node, the sinking current sinking from the oscillator through the sink node, and wherein each of the sourcing current and the sinking current is determined by a current sum of the first bias current and the second bias current.

20. The integrated circuit of claim 18, wherein the first bias current generating circuit comprises:

the variable resistor including a first end and a second end;

a first operational amplifier receiving a fixed voltage at a positive input terminal, the fixed voltage having a fixed level, a negative input terminal and an output terminal of the first operational amplifier being coupled to the second end of the variable resistor;

a second operational amplifier receiving the control voltage at a positive input terminal, a negative input terminal of the second operational amplifier being coupled to the first end of the variable resistor;

an NMOS transistor including a gate terminal coupled to an output terminal of the second operational amplifier, a source terminal coupled to the first end of the variable resistor, and a drain terminal to which the first bias current is generated; and a current mirror circuit assembly coupled to the drain terminal of the NMOS transistor and configured to copy the first bias current to the oscillator.

* * * * *

UNITED STATES PATENT AND TRADEMARK OFFICE
CERTIFICATE OF CORRECTION

PATENT NO. : 10,536,114 B2
APPLICATION NO. : 15/641581
DATED : January 14, 2020
INVENTOR(S) : Wookang Jin, Sungwon Yun and Chan Son It is certified that error appears in the above-identified patent and that said Letters Patent is hereby corrected as shown below:

In the Claims

Column 17, Claim 14, replace with the following text:
14. The oscillator circuit of claim 13, wherein the frequency range is defined by a first frequency and a second frequency,
    wherein the first frequency is tuned by trimming the second bias current using a current source in the second bias current generating circuit when the control voltage is set so that the first bias current has a minimum value, and
    wherein, after the first frequency is tuned, the second frequency is tuned by trimming a resistance of the variable resistor in the first bias current generating circuit when the control voltage is set so that the first bias current has a maximum value.

Signed and Sealed this
Twenty-fifth Day of February, 2020

Andrei Iancu
*Director of the United States Patent and Trademark Office*